(12) United States Patent
Lee

(10) Patent No.: US 7,001,815 B2
(45) Date of Patent: Feb. 21, 2006

(54) METHOD OF MANUFACTURING SEMICONDUCTOR DEVICE WITH TRIPLE GATE INSULATING LAYERS

(75) Inventor: Ki-min Lee, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/912,050

(22) Filed: Aug. 6, 2004

(65) Prior Publication Data

US 2005/0032286 A1 Feb. 10, 2005

(30) Foreign Application Priority Data

Aug. 7, 2003 (KR) .................. 10-2003-0054585

(51) Int. Cl.
*H01L 21/336* (2006.01)
(52) U.S. Cl. .................. 438/287; 438/216; 257/406
(58) Field of Classification Search ........ 257/392–395, 257/406, 410; 438/216, 287, 261, 303
See application file for complete search history.

(56) References Cited

U.S. PATENT DOCUMENTS

| 6,204,137 | B1 | | 3/2001 | Teo et al. | |
| 6,329,697 | B1 | * | 12/2001 | Shin | 257/501 |
| 6,365,450 | B1 | | 4/2002 | Kim | |
| 6,406,945 | B1 | | 6/2002 | Lee et al. | |
| 6,515,338 | B1 | | 2/2003 | Inumiya | |
| 6,544,827 | B1 | | 4/2003 | Abiko | |
| 6,879,001 | B1 | * | 4/2005 | Yagishita et al. | 257/347 |
| 2004/0173854 | A1 | * | 9/2004 | Kwon et al. | 257/365 |

* cited by examiner

*Primary Examiner*—David Nelms
*Assistant Examiner*—Calvin Lee
(74) *Attorney, Agent, or Firm*—Pillsbury Winthrop Shaw Pittman LLP

(57) ABSTRACT

An object of the present invention is to provide a method of manufacturing a semiconductor device with triple gate insulating layers that is capable of easily obtaining thicknesses and good qualities of the gate insulating layers being opportune to multiple devices.

In the present invention, gate insulating layers having thicknesses and good qualities corresponding to each of transistors can be easily formed in a semiconductor device with triple gate insulating layers by using dummy gates. Furthermore, in the present invention, a device of high integration density is easily manufactured, as gates of a high voltage device region and a middle voltage device region have finer line widths than a gate of a low voltage device region by forming them using dummy gates.

11 Claims, 3 Drawing Sheets

METHOD OF MANUFACTURING SEMICONDUCTOR DEVICE WITH TRIPLE GATE INSULATING LAYERS

BACKGROUND OF THE INVENTION (a) Field of the Invention

The present invention relates to a method of manufacturing a semiconductor device, and more particularly to a method of manufacturing a semiconductor device with triple gate insulating layers.

(b) Description of the Related Art

Generally, a Metal Oxide Silicon (MOS) transistor has a gate insulating layer formed on a semiconductor substrate, a gate formed on the gate insulating layer, and source and drain regions formed within the substrate. Various manufacturing methods of this transistor are disclosed in U.S. Pat. Nos. 6,204,137, 6,365,450, 6,406,945, 6,515,338 and 6,544,827.

Recently, to satisfy requirements of variously manufactured goods, a technique for forming devices to be applied for several objectives in one chip has been researched.

In this technique, as gate voltages of MOS transistors applied to the devices are different from each other, gate insulating layers must be formed with different thicknesses in each of the devices.

For example, in the case a high voltage device, a middle voltage device and a low voltage device are formed in one chip, triple gate insulating layers having different from thickness from each other are employed. More specifically, a first gate insulating layer of a first thickness to be relatively thick is formed at the high voltage device region, a second gate insulating layer of a second thickness to be thinner than the first thickness is formed at the middle voltage device region, and a third gate insulating layer of a third thickness to be thinner than the second thickness is formed at the low voltage device region.

Therefore, to obtain good properties corresponding to each of the devices, it is important that thicknesses and good qualities of gate insulating layers being opportune to each of the devices are obtained.

SUMMARY OF THE INVENTION

An object of the present invention is to provide a method of manufacturing a semiconductor device with triple gate insulating layers that is capable of easily obtaining thicknesses and good qualities of the gate insulating layers being opportune to multiple devices.

The object of the present invention as noted above is accomplished by a method of manufacturing a semiconductor device that includes providing a semiconductor substrate in which a first region, a second region and a third region are defined; forming a first oxide layer at the first region having a relatively thick thickness compared with the other regions on the entire surface of the substrate; forming a dummy gate material layer on the first oxide layer; patterning the dummy gate material layer and the first oxide layer to respectively form a first pattern of the first oxide layer and a first dummy gate on the substrate of the first region, and to respectively form a second pattern of the first oxide layer and a second dummy gate on the substrate of the second region. The method further includes forming a gate insulating layer of a second oxide layer and having a first thickness and a gate on the substrate of the third region; ion-implanting low concentration impurities into the substrate; respectively forming spacers on the sidewalls of the first gate and the first and second dummy gates; ion-implanting high concentration impurities into the substrate, to form source and drain regions; forming an intermediate insulating layer respectively exposing the surfaces of the first gate the first and second dummy gates and having a smooth surface on the entire surface of the substrate; and selectively removing the first and the second dummy gates, to form first and second holes respectively exposing the first and second patterns of the first oxide layer. The method also includes forming a third oxide layer on the surfaces of the first and second holes and the intermediate insulating layer; depositing a gate material layer on the third oxide layer so as to fill the first and second holes, and removing the gate material layer and the third oxide layer so as to expose the surface of the intermediate insulating layer, to form a second gate insulating layer consisting of the third oxide layer and the first pattern of the first oxide layer and having a second thickness being thicker than the first thickness on the substrate of the first region, and to form a third gate insulating layer consisting of the third oxide layer and the second pattern of the first oxide layer and having a third thickness being thicker than the first thickness and being thinner than the second thickness on the substrate of the second region.

Here, the step of forming the first oxide layer includes forming an impurity implantation layer within the surface of the substrate, and oxidizing the substrate.

Furthermore, the step of forming the impurity implantation layer includes forming a photoresist pattern exposing the substrate of the first region on the substrate, ion-implanting impurities into the substrate using the photoresist pattern as a mask, and the removing the photoresist pattern. Preferably, the impurities are As ion.

Furthermore, the dummy gate material layer is formed of a material having high etching selectivity to the first gate and the intermediate insulating layer. Preferably, the dummy gate material layer is formed of a nitride layer.

Furthermore, the step of removing the first and second dummy gates is performed by wet etching using hot phosphoric acid.

DETAILED DESCRITPION OF THE PREFERRED EMBODIMENTS

The present invention will now be described more fully hereinafter with reference to the accompanying drawings, in which a preferred embodiment of the invention is shown. The invention may, however, be embodied in many different forms and should not be construed as being limited to the embodiment set forth herein.

A method of manufacturing a semiconductor device with triple gate insulating layers will be described with reference to FIGS. 1A–1H.

Figure 1A:
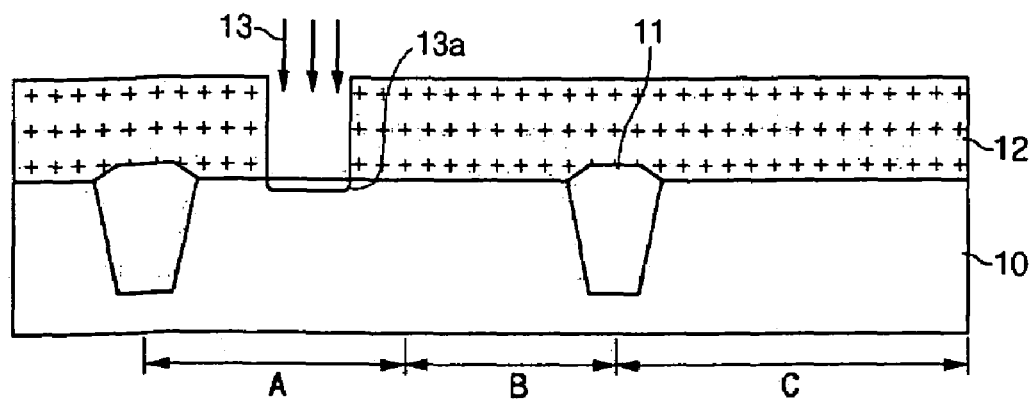
FIGS. 1A–1H are cross-sectional views for describing a method of manufacturing a semiconductor device with triple gate insulating layers according to an embodiment of the present invention.

As shown in FIG. 1A, a semiconductor substrate 10 in which a first region A, a second region B, and a third region C are defined and isolating layers are formed by shallow trench isolation (STI), is provided. A high voltage device is formed at the first region A, a middle voltage device is formed at the second region B, and a low voltage device is formed at the third region C. The semiconductor substrate 10 is formed as a silicon substrate. A first photoresist pattern 12 exposing the substrate 10 of the first region A is then formed on the substrate 10 by photolithography. Thereafter, impurities, preferably As ions, are implanted into the substrate 10 by ion-implantation 13, to form an impurity implantation layer 13a within the surface of the exposed substrate 10 of the first region A. The As ions are advantageous to adjust an oxide thickness, as they appear as a concentration peak at a specific distance from the surface of the substrate 10.

Figure 1B:
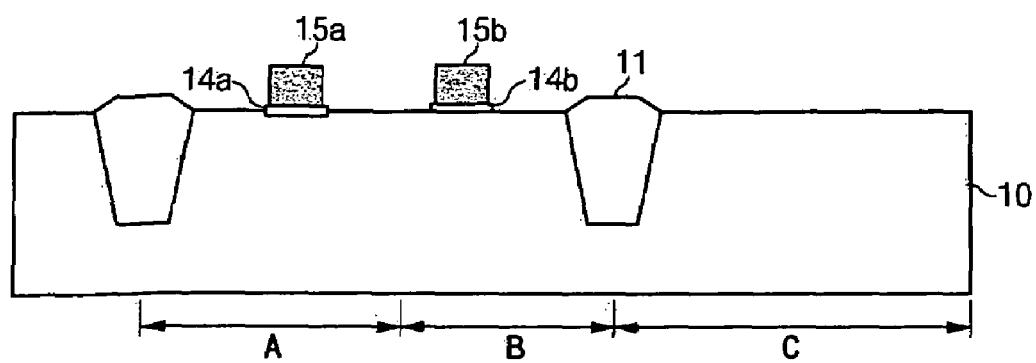

As shown in FIG. 1B, the photoresist pattern 12 is removed by a well-known method, and a first oxide layer of silicon oxide ($SiO_2$) is then formed on the entire surface of the substrate 10 by a thermal oxidation process. At this time, the first oxide layer is relatively thickly formed at the first region compared with the other regions.

Namely, as an oxidation rate $X_o/t$ at the substrate 10 is in proportion to the impurity concentration of the substrate 10 as shown in the following equation 1, oxidation is performed relatively quickly at the first region A due to the impurity implantation layer 13a. Therefore, the first oxide layer is thickly formed at the first oxide layer compared with the other regions.

$$X_o/t \propto 1 + r(Cv-1) \quad \text{equation 1}$$

wherein $X_o$ is oxide thickness, t is oxidation time, r is a variable to an oxidation material, and Cv is a total concentration of the oxidation material.

Thereafter, a material having high etching selectivity to a gate and an intermediate insulating layer which will be formed after, preferably a nitride layer of silicon nitride (SiN), is formed on the first oxide layer. The nitride layer and the first oxide layer are then patterned by a photolithography and an etching process, to form a first pattern 14a of the first oxide layer and a first dummy gate 15a on the substrate 10 of the first region A, and to form a second pattern 14b of the first oxide layer and a second dummy gate 15b on the substrate 10 of the second region B. At this time, the thickness of the first pattern 14a of the first oxide is thicker that of the second pattern 14b of the first oxide layer.

Figure 1C:
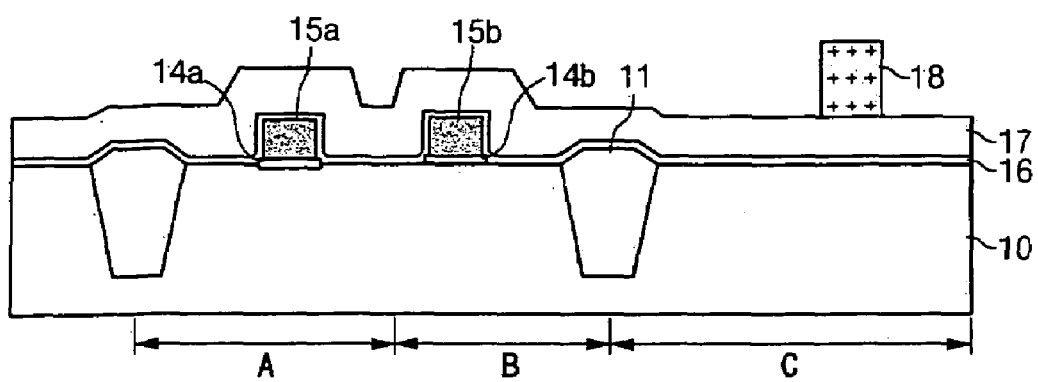

As shown in FIG. 1C, a second oxide layer 16 of silicon oxide is deposited on the entire surface of the substrate so as to cover the first and second dummy gates 15a and 15b, and a first polysilicon layer 17 is then deposited on the second oxide layer 16. Thereafter, a second photoresist pattern 18 masking a portion of the third region C is formed on the first polysilicon layer 17 by photolithography.

Figure 1D:
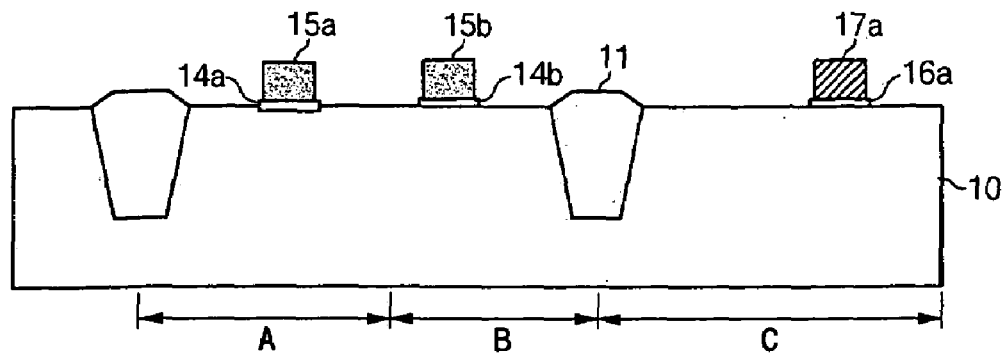

As shown in FIG. 1D, the first polysilicon layer 17 and the second oxide layer 16 are etched by an etching process using the second photo resist pattern as a mask, to form a first gate insulating layer 16a having a first thickness and a first gate 17a on the substrate 10 of the third region C. The second photoresist pattern 18 is removed by a well-known method.

Figure 1E:
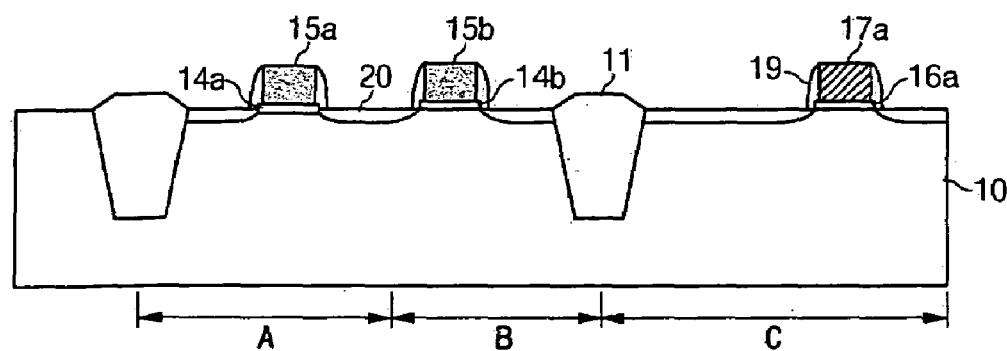

As shown in FIG. 1E, low concentration impurities are ion-implanted into the substrate 10. A TEOS layer is then deposited on the entire surface of the substrate, and is etched by blanket etching, to form spacers on the sidewalls of the first gate 19 and the first and second dummy gates 15a and 16b. Thereafter, high concentration impurities are ion-implanted into the substrate 10, to form source and drain regions 20 within the substrate 10 of both sides of the first gate 19 and the first and second dummy gates 15a and 15b.

Figure 1F:
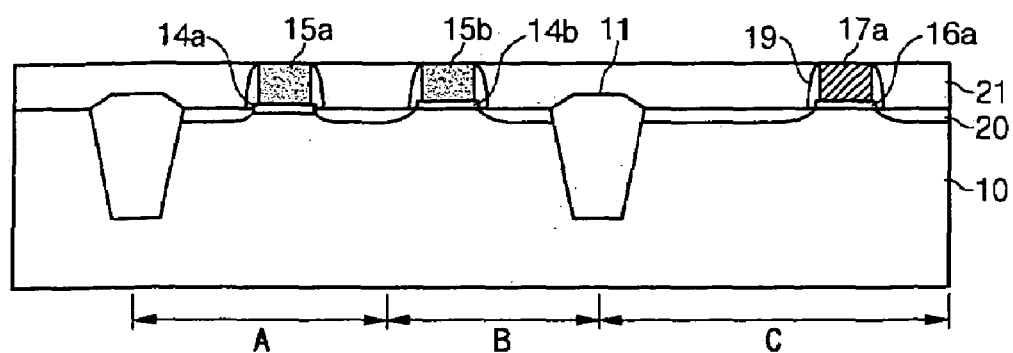

As shown in FIG. 1F, an intermediate insulating layer 21 is deposited on the entire surface of the substrate, and is then removed by a chemical mechanical polishing (CMP) or etch-back process so as to expose the surfaces of the first and second dummy gates 15a and 15b, thereby planarizing its surface. Here, the intermediate insulating layer 21 is formed of a USG layer or a TEOS layer.

Figure 1G:
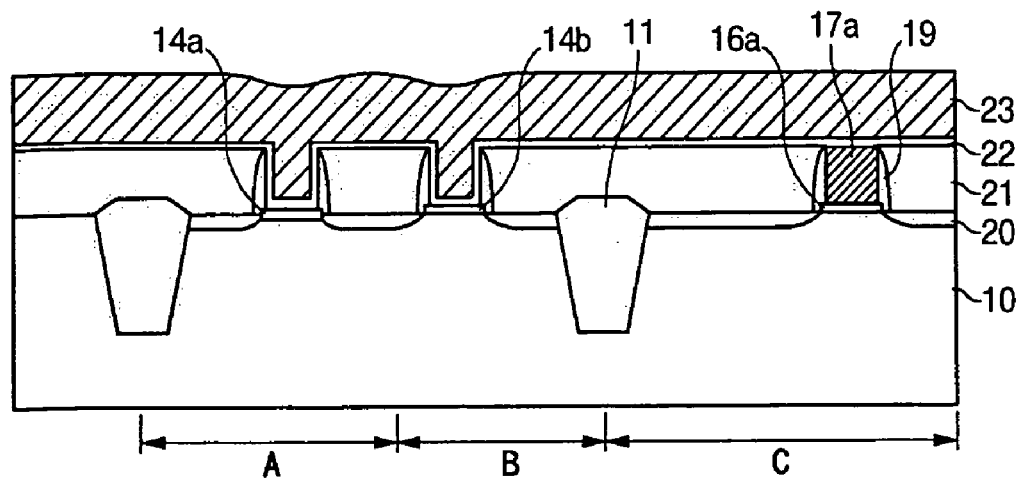

As shown in FIG. 1G, the exposed fist and second dummy gates 15a and 15b are removed by wet etching, to form first and second holes respectively exposing the first and second patterns 14a and 14b of the first oxide layer. Preferably, the wet etching is performed using hot phosphoric acid. Thereafter, a third oxide layer 22 of silicon oxide is formed on the surfaces of the first and second holes and the intermediate insulating layer 21, and a second polysilicon layer 23 is then deposited on the third oxide layer 22.

Figure 1H:
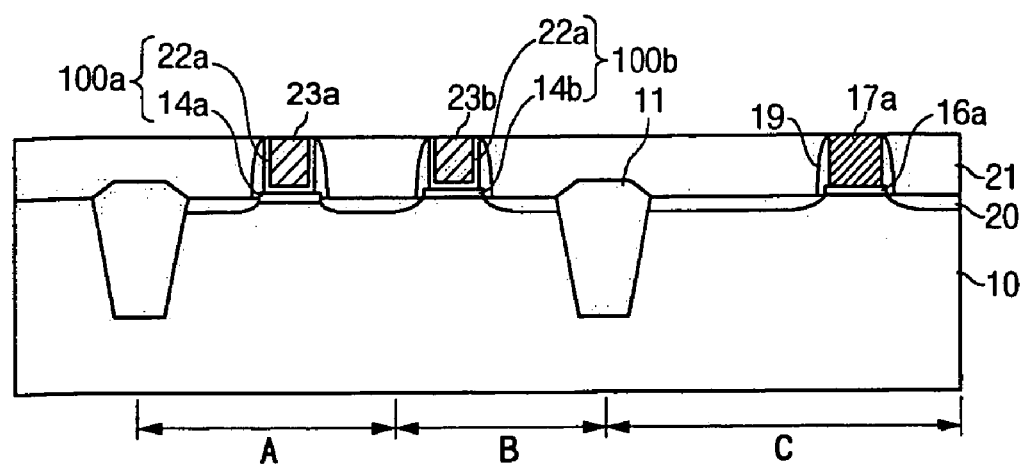

As shown in FIG. 1H, the second polysilicon layer 23 and the third oxide layer 22 are removed by a CMP or an etch-back process so as to expose the surfaces of the intermediate insulating layer 21. As a result, a second gate insulating layer 100a and a second gate 23a are formed on the substrate 10 of the first region A, a third gate insulating layer 100b and a third gate 23b are formed on the substrate 10 of the second region B, and the surface of the substrate is planarized. At this time, the second gate insulating layer 100a consists of a third oxide pattern 22a and the first pattern 14a of the first oxide layer, to have a second thickness being thicker than the first thickness, and the third gate insulating layer 100b consists of the third oxide pattern 22a and the second pattern of the first oxide layer, to have a third thickness being thicker than the first thickness and being thinner than the second thickness.

As described in the above, the present invention has an advantage in that gate insulating layers having thicknesses and good qualities corresponding to each of transistors can be easily formed in a semiconductor device with triple gate insulating layers by using dummy gates.

Furthermore, the present invention has another advantage in that a device of high integration density is easily manufactured, as gates of a high voltage device region and a middle voltage device region have a finer line width than a gate of a low voltage device region by forming them using dummy gates.

While the present invention has been described in detail with reference to the preferred embodiments, it is to be understood that the invention is not limited to be disclosed embodiments, but, on the contrary, is intended to cover various modifications and equivalent arrangements included within the spirit and scope of the appended claims.

What is claimed is:

1. A method of manufacturing a semiconductor device comprising:

providing a semiconductor substrate in which a first region, a second region and a third region are defined;

forming a first oxide layer having a relatively thick thickness at the first region compared with the other regions on the entire surface of the substrate;

forming a dummy gate material layer on the first oxide layer;

patterning the dummy gate material layer and the first oxide layer to respectively form a first pattern of the first oxide layer and a first dummy gate on the substrate of the first region, and to respectively form a second pattern of the first oxide layer and a second dummy gate on the substrate of the second region;

forming a gate insulating layer of a second oxide layer and having a first thickness and a gate on the substrate of the third region;

ion-implanting low concentration impurities into the substrate;

respectively forming spacers on the sidewalls of the first gate and the first and
second dummy gates;

ion-implanting high concentration impurities into the substrate, to form source and drain regions;

forming an intermediate insulating layer respectively exposing the surfaces of the first gate and the first and second dummy gates and having a smooth surface on the entire surface of the substrate;

selectively removing the first and the second dummy gates, to form first and second holes respectively exposing the first and second patterns of the first oxide layer;

forming a third oxide layer on the surfaces of the first and second holes and the intermediate insulating layer;

depositing a gate material layer on the third oxide layer so as to fill the first and second holes; and removing the gate material layer and the third oxide layer so as to expose the surface of the intermediate insulating layer, to form a second gate insulating layer consisting of the third oxide layer and the first pattern of the first oxide layer and having a second thickness being thicker than the first thickness on the substrate of the first region, and to form a third gate insulating layer consisting of the third oxide layer and the second pattern of the first oxide layer and having a third thickness being thicker than the first thickness and being thinner than the second thickness on the substrate of the first region.

2. The method of claim 1, wherein the step of forming the first oxide layer includes forming an impurity implantation layer within the surface of the substrate, and oxidizing the substrate.

3. The method of claim 2, wherein the step of forming the impurity implantation layer includes forming a photoresist pattern exposing the substrate of the first region on the substrate, ion-implanting impurities into the substrate using the photoresist pattern as a mask, and removing the photoresist pattern.

4. The method of claim 2, wherein the impurities are As ions.

5. The method of claim 1, wherein the dummy gate material layer is formed of a material having high etching selectivity to the first gate and the intermediate insulating layer.

6. The method of claim 5, wherein the dummy gate material layer is formed of a nitride layer.

7. The method of claim 5, wherein the intermediate insulating layer is formed of a USG layer or a TEOS layer.

8. The method of claim 1, wherein the spacer is formed of a TEOS layer.

9. The method of claim 1, wherein the step of removing the first and second dummy gates is performed by wet etching.

10. The method of claim 9, wherein the wet etching is performed using hot phosphoric acid.

11. The method of claim 1, wherein the step of removing the gate material layer and the third oxide layer is performed by a chemical mechanical polishing (CMP) or etch-back process.

* * * * *